(12) United States Patent
Lanier

(10) Patent No.: US 7,180,339 B2
(45) Date of Patent: Feb. 20, 2007

(54) SYNTHESIZER AND METHOD FOR GENERATING AN OUTPUT SIGNAL THAT HAS A DESIRED PERIOD

(75) Inventor: Tyre Paul Lanier, Greensboro, NC (US)

(73) Assignee: Analog Devices, Inc., Norwood, MA (US)

(*) Notice: Subject to any disclaimer, the term of this patent is extended or adjusted under 35 U.S.C. 154(b) by 20 days.

(21) Appl. No.: 10/833,606

(22) Filed: Apr. 26, 2004

(65) Prior Publication Data

US 2005/0237090 A1    Oct. 27, 2005

(51) Int. Cl.
*H03K 21/00* (2006.01)

(52) U.S. Cl. .................... 327/115; 327/117; 377/48

(58) Field of Classification Search ............... 327/115, 327/117; 377/47, 48; 703/103
See application file for complete search history.

(56) References Cited

U.S. PATENT DOCUMENTS

| | | | |
|---|---|---|---|
| 4,577,163 A | 3/1986 | Culp | |
| 5,088,057 A | 2/1992 | Amrany et al. | |
| 5,218,314 A | 6/1993 | Efendovich et al. | |
| 5,355,037 A | 10/1994 | Andresen et al. | |
| 5,889,436 A | 3/1999 | Yeung et al. | |
| 5,970,110 A | 10/1999 | Li | |
| 6,157,694 A | 12/2000 | Larsson | |
| 6,194,950 B1 | 2/2001 | Kibar et al. | |
| 6,222,895 B1 | 4/2001 | Larsson | |
| 6,310,498 B1 | 10/2001 | Larsson | |
| 6,353,649 B1 | 3/2002 | Bockleman et al. | 375/376 |
| 6,459,753 B2 * | 10/2002 | Verlinden | 377/48 |
| 6,480,047 B2 | 11/2002 | Abdel-Maguid et al. | |
| 6,556,086 B2 | 4/2003 | Keavency et al. | |
| 6,603,360 B2 | 8/2003 | Kim et al. | |
| 6,614,319 B2 | 9/2003 | Saeki et al. | |
| 6,617,893 B1 | 9/2003 | Born et al. | |
| 6,618,462 B1 | 9/2003 | Ross et al. | |
| 6,944,257 B2 * | 9/2005 | Riley | 377/47 |
| 2002/0101955 A1 | 8/2002 | Poulet | 377/48 |

* cited by examiner

*Primary Examiner*—Kenneth B. Wells
(74) *Attorney, Agent, or Firm*—Koppel, Patrick & Heybl

(57) ABSTRACT

A frequency synthesizer includes a circuit which selectively outputs multiple output signals having different respective periods to drive the average period of a combined output signal to substantially equal a desired period.

10 Claims, 7 Drawing Sheets

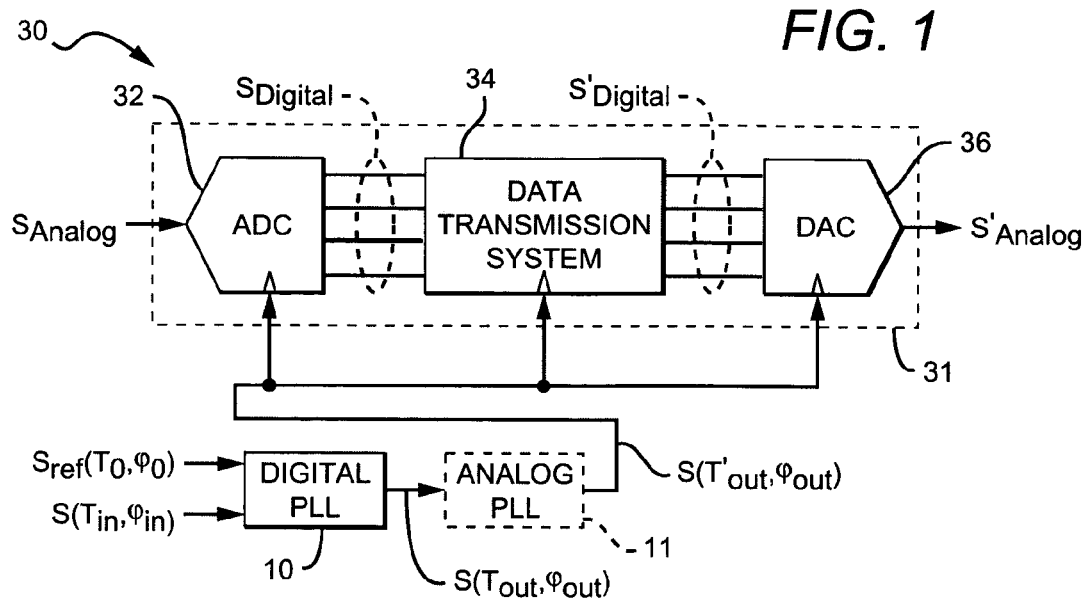
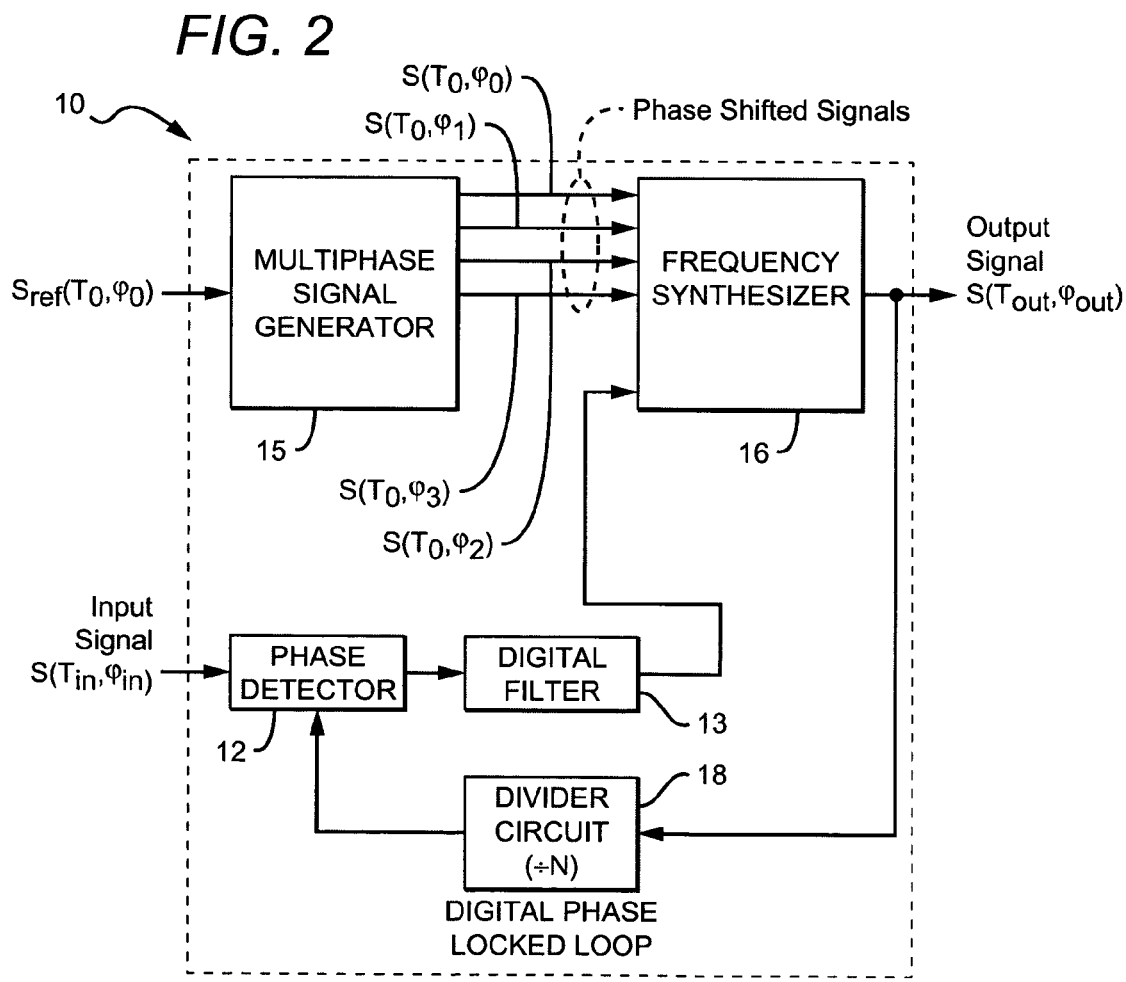

SYNTHESIZER AND METHOD FOR GENERATING AN OUTPUT SIGNAL THAT HAS A DESIRED PERIOD

BACKGROUND OF THE INVENTION

1. Field of the Invention

This invention relates generally to electronic circuits and, more particularly, to electronic circuits which generate a sequence of pulses with a desired period.

2. Description of the Related Art

Electronic circuits can generate a sequence of pulses which can be used in many applications, such as clocks and pulse generators. In various applications it may be desired to generate a sequence of pulses with a period which is either an integer multiple or a non-integer multiple of a reference clock period. A non-integer multiple can be represented as M/N=P.Q, where M and N are natural numbers and P and Q are integer and decimal numbers, respectively. Hence, M/N is a rational number expressed as a fraction and P.Q is its equivalent expressed as a decimal. In an example, if the reference clock period is 10 ns (i.e. 100 MHz), then to produce a signal with a period of 48.8 ns (i.e. 20.5 MHz), the reference clock period can be multiplied by 4.88 (i.e. M=488, N=100, P=4, and Q=0.88). This is equivalent to dividing the reference clock frequency by 4.88 (i.e. 100 MHz/4.88=20.5 MHz).

Several approaches have been proposed to generate output signals with a period which is a non-integer multiple of a reference period. However, these approaches have jitter which limits their usefulness. Jitter refers to variations in the pulse positions caused by switching between two signals with different phases and appears in the output signal as noise and/or an unintended frequency modulation. Noise typically decreases the signal-to-noise ratio of the system.

Jitter can cause errors in the phase determination of the output signal and, consequently, can reduce the phase margin. The phase of the output signal can be used in many applications, such as analog-to-digital and digital-to-analog converters to define time-points at which the data is sampled. If the phase of the output signal jitters, then there can be errors in the time-points which will affect the overall signal quality.

One way to generate signals with non-integer multiple periods is the rational-rate approach. This approach, as disclosed in U.S. Pat. No. 5,088,057, divides the reference clock frequency by two different integer values to generate two sub-frequencies. The system then switches between the two sub-frequencies to produce an average clock frequency. However, one problem with the rational-rate approach is that the average clock frequency appears to jitter between the phases of the two sub-frequencies. Because the sub-frequencies are generated by dividing by integer numbers, the jitter is on the order of a clock cycle.

Another approach is referred as fractional-frequency divider. As disclosed in U.S. Pat. No. 6,157,694, the system provides several phase-shifted reference signals which have pulse edges shifted over the reference signal period. One pulse edge is outputted at a particular time in response to a trigger signal to provide a high-to-low or a low-to-high pulse edge for the output signal. Hence, the timing of the triggering events determines the frequency of the output signal. However, the fractional-frequency approach also generates jitter in the output signal because the switching is between two phase-shifted signals whose pulse edges, in general, do not always occur at the correct time.

In the rational-rate and fractional frequency approaches, jitter can be reduced by increasing the frequency of the reference signal. Jitter can also be reduced in the fractional frequency approach by increasing the number of phase-shifted signals. However, increasing the reference frequency and the number of phase-shifted signals increases the complexity and cost of the circuitry. Consequently, there is a need for a frequency synthesizer which provides an output signal with an arbitrary period and less jitter, using a lower frequency reference signal and fewer phase shifted signals.

SUMMARY OF THE INVENTION

The Embodiments of the present invention provide a frequency synthesizer which selectively outputs multiple output signals having different periods so that an average period of a combined output signal is driven to substantially equal a desired period. The multiple output signals can be outputted in response to an error signal which is proportional to the difference between the average and desired periods.

In one aspect of the present invention, a signal processing system with a frequency synthesizer includes a signal selection circuit which outputs a selected phase-shifted reference signal in a plurality of phase-shifted reference signals in response to a control signal. A toggle circuit is coupled to an output of the signal selection circuit and alternately outputs multiple output signals in response to a select signal. A control circuit is coupled to an output of the signal selection circuit and provides the control and select signals to the signal selection and toggle circuits, respectively.

These and other features, aspects, and advantages of the present invention will become better understood with reference to the following drawings, description, and claims.

BRIEF DESCRIPTION OF THE DRAWINGS

FIG. 1 is a simplified block diagram of a communication system in accordance with the present invention;

FIG. 2 is a simplified block diagram of a phase locked loop included in FIG. 1;

DETAILED DESCRIPTION OF THE INVENTION

Figure 3:
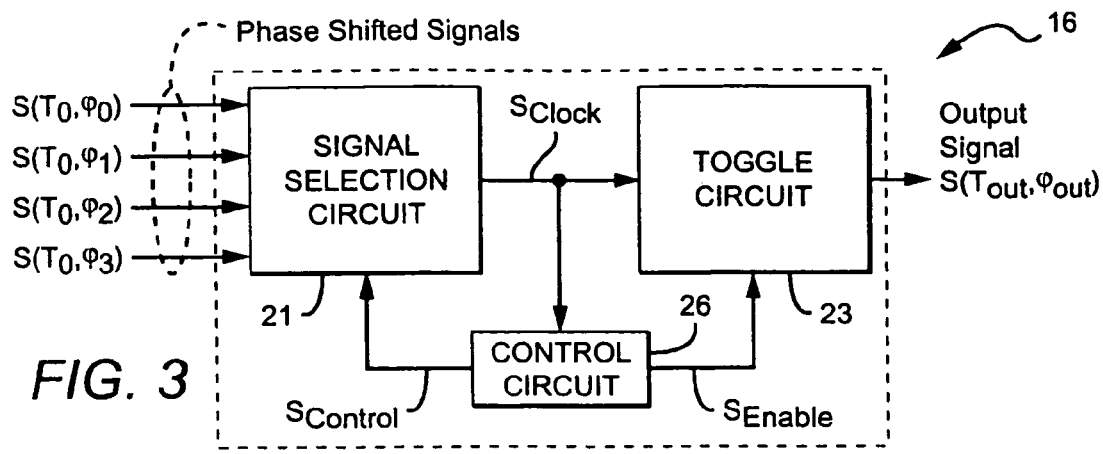
FIG. 3 is a simplified block diagram of a frequency synthesizer shown in FIG. 2.

FIG. 1 is a simplified block diagram of a communication system 30 which implements one embodiment of the invention. System 30 includes a signal processing system 31 coupled to a digital phase locked loop (PLL) 10 through an analog PLL 11. System 31 includes an analog-to-digital converter (ADC) 32 which receives inputs from a digital-to-analog converter (DAC) 36 through a data transmission system 34. PLLs 10 and 11 can be included in communication systems other than the one illustrated in FIG. 1 to provide a sequence of pulses with a desired period, where the period can be an integer or a non-integer multiple of a reference clock period. However, PLLs 10 and 11 are shown in communication system 30 to illustrate one particular embodiment of the invention.

PLL 10 provides a clock signal $S(T_{out}, \Phi_{out})$ in response to both an input signal $S(T_{in}, \Phi_{in})$ and a reference signal $S_{ref}(T_0, \Phi_0)$, in which $T_{out}$ can be an integer (i.e. 5) or a non-integer multiple (i.e. 4.33) of $T_{in}$. PLL 11 provides a clock signal $S(T'_{out}, \Phi'_{out})$, in response to $S(T_{out}, \Phi_{out})$, to ADC 32, DAC 36, and system 34. T refers to a signal period, f refers to a signal frequency (f=1/T), and $\Phi$ refers to a signal phase.

PLL 11 is an optional component in system 30, and is included to multiply $T_{out}$ by a small value to provide $T'_{out}$. Analog PLLs can typically multiply signal periods by smaller numbers faster and more accurately than digital PLLs. Analog PLLs can also filter out high frequency noise better than digital PLLs. Hence, digital PLL 10 can provide $T_{out}$ by multiplying $T_{in}$ by a larger integer or non-integer number. Analog PLL 11 can then multiply $T_{out}$ by a smaller integer number to provide $T'_{out}$, and filter high frequency noise that may be in signal $S(T'_{out}, \Phi'_{out})$.

In operation, ADC 32 samples signal $S_{Analog}$ at a frequency $f_{out}$ to provide a corresponding digital signal $S_{Digital}$. $S_{Digital}$ is processed by and transmitted through system 34, where system 34 outputs a digital signal $S'_{Digital}$. $S'_{Digital}$ is provided to converter 36, where it is converted back into an analog signal $S'_{Analog}$. Hence, ADC 32 and DAC 36 sample the corresponding data at a rate determined by $T'_{out}$, where $T'_{out}$ can be within one phase step of the desired period. This reduces the jitter and also increases the signal-to-noise ratio of the converted signals when $T'_{out}$ is an integer or non-integer multiple of $T_{in}$.

DAC 36 is illustrated for simplicity and ease of discussion and can be replaced with another digital system, such as a display device or a data processing system. A display device can be used when it is desired to provide information included in $S'_{Digital}$ in a visual format, such as in a video system. A data processing system can be used when it is desired to perform calculations or otherwise manipulate data in response to $S'_{Digital}$.

FIG. 2 illustrates a more detailed view of digital PLL 10. PLL 10 includes a phase detector 12 coupled to a frequency synthesizer 16 through a digital filter 13. A multiphase signal generator 15 is also connected to frequency synthesizer 16. Detector 12 receives $S_{Analog}$, generator 15 receives $S_{ref}(T_0, \Phi_0)$, and synthesizer 16 provides $S(T_{out}, \Phi_{out})$.

Filter 13 can include a finite impulse response filter, an infinite impulse response filter, or another digital filter. If filter 13 includes an analog filter, then PLL 10 corresponds to an analog PLL. In this case, the analog filter can include a low pass filter or another analog filter which can filter a desired range of frequencies and/or provide signal amplification. For the analog PLL case, an external reference signal may not be needed because $S_{ref}(T_0, \Phi_0)$ can be generated internally by the analog filter and provided to generator 15. PLL 11 can be an analog version of PLL 10, which can multiply $T_{out}$ by an integer or a non-integer number, with filter 13 replaced with an analog filter.

Generator 15 provides phase-shifted signals of $S_{ref}(T_0, \Phi_0)$, denoted as $S(T_0, \Phi_0)$, $S(T_0, \Phi_1)$, $S(T_0, \Phi_2)$, and $S(T_0, \Phi_3)$ (i.e. "the phase-shifted signals"). Generator 15 can include a multi-phase ring oscillator, a digital delay line, or a delayed locked loop to generate the phase-shifted signals.

A divider circuit 18 is coupled between synthesizer 16 and phase detector 12. If the divisor of divider circuit 18 is N, then the period of a signal fed back to phase detector 12 is equal to $N \cdot T_{out}$ and is denoted as $S(N \cdot T_{out}, \Phi_{out})$. Hence, synthesizer 16 can provide a signal with a period that is a multiple of $T_{in}$, where $\Phi_{in}$ equals $\Phi_{out}$ when $S(T_{in}, \Phi_{in})$ and $S(T_{out}, \Phi_{out})$ are locked.

Period $T_0$ is typically much smaller than both $T_{in}$ and $T_{out}$ so that frequency $f_0$ is greater than $f_{in}$ and $f_{out}$. In this way, $S_{ref}(T_0, \Phi_0)$ will have pulse edges positioned (i.e. phase-shifted) at closely spaced time intervals compared to both $S(T_{in}, \Phi_{in})$ and $S(T_{out}, \Phi_{out})$. These pulse edges can be selected at particular times by synthesizer 16 to provide signals which approximate $S(T_{out}, \Phi_{out})$, as will be discussed in more detail below.

In operation, input signal $S(T_{in}, \Phi_{in})$ is provided to phase detector 12 which detects $\Phi_{in}$. PLL 10 adjusts the period and phase of $S(T_{out}, \Phi_{out})$ in response to $S_{ref}(T_0, \Phi_0)$ and $S(T_{in}, \Phi_{in})$. Detector 12 compares phase $\Phi_{in}$ with phase $\Phi_{out}$ and provides to filter 13 a signal denoted as $S(\Phi_{in} - \Phi_{out})$ which is proportional to the difference between the two phases (i.e. $\Phi_{in} - \Phi_{out}$). The frequency response of filter 13 is chosen to minimize high frequency fluctuations in the phases between signals $S(T_{in}, \Phi_{in})$ and $S(T_{out}, \Phi_{out})$ so that $S(\Phi_{in} - \Phi_{out})$ is approximately a constant signal. Frequency synthesizer 16 determines which phase-shifted signal should be outputted at a particular time so that $T_{out} = (M/N) \cdot T_{in} = P \cdot Q \cdot T_{in}$. This equation can be rewritten as $T_{out} = (M \cdot m/N) \cdot T_{in} = (P \cdot Q) \cdot m \cdot T_{in}$, where m is the number of phase steps per clock cycle. One phase step is the time spacing between the phase-shifted reference signals.

FIG. 3 illustrates one embodiment of synthesizer 16. Synthesizer 16 includes a signal selection circuit 21 which outputs a clock signal $S_{Clock}$ to a toggle circuit 23 and a control circuit 26. Control circuit 26 provides a phase control signal $S_{Control}$ to circuit 21 and an enable signal $S_{Enable}$ to toggle circuit 23. Circuit 21 outputs a desired phase-shifted signal to circuits 23 and 26 in response to $S_{Control}$. Hence, $S_{Clock}$ is a composite signal determined by $S_{Control}$ and formed from the phase-shifted signals. Trigger circuit 23 outputs high-to-low or low-to-high pulse edges at predetermined times in response to $S_{Clock}$ to form an output signal.

Generally, two or more output signals are selectively outputted so that the average is $S(T_{out}, \phi_{out})$ For simplicity and ease of discussion, it is assumed that two signals, denoted as $S(T_{out1}, \phi_{out1})$ and $S(T_{out2}, \phi_{out2})$, are outputted by circuit 23. The predetermined times can be chosen so that the periods of the two output signals average to $T_{out}(T_{out} = (T_{out1} + T_{out2})/2)$. Control circuit 26 can choose $T_{out1}$ and $T_{out2}$ similar to the rational rate approach so that the jitter is driven to a predetermined number of phase steps. The predetermined number of phase steps is generally less than m phase steps and, preferably, one phase step.

Figure 4:
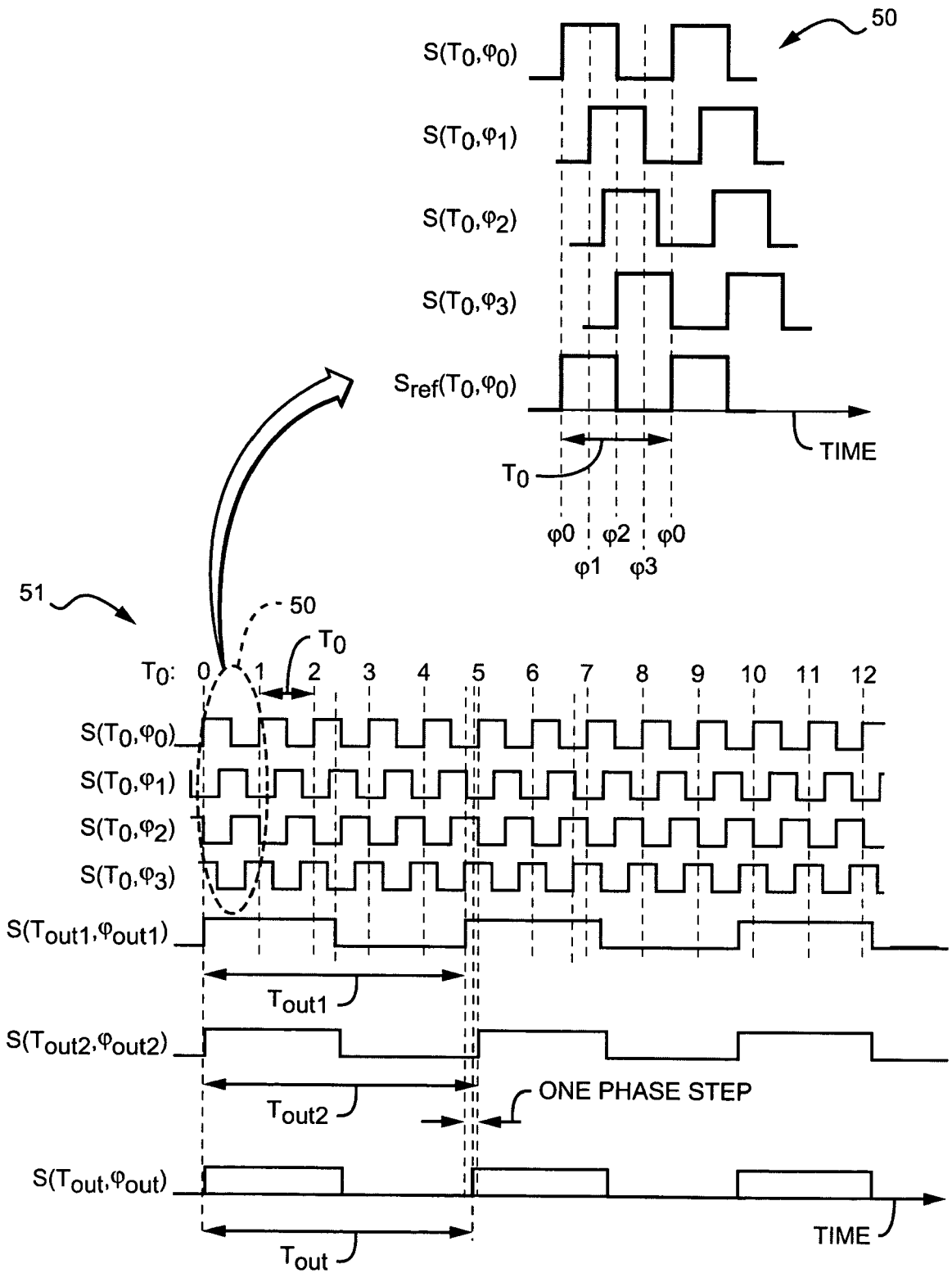
FIG. 4 is a timing diagram of the phase-shifted reference signals shown in FIG. 2.

FIG. 4 illustrates a timing diagram 51 showing the phase-shifted reference signals and signals $S(T_{out1}, \phi_{out1})$, S($T_{out2}$, φ$_{out2}$), and S($T_{out}$, φ$_{out}$). A blown-up portion 50 of timing diagram 51 is also illustrated. As shown in blown-up portion 50, the phase-shifted signals are same as signal S$_{ref}$($T_{out}$, φ$_{out}$) except for having shifted phases (i.e. φ$_1$=0°, φ$_2$=90°, f$_3$=180°, and φ$_4$=270°, for example) so that the phase-shifted signals are spaced apart over T0. The phases can be shifted in a manner similar to the fractional frequency divider approach. The accuracy of the output signal generally increases and the jitter decreases with more phase-shifted signals because there is better time resolution (i.e. the spacing between the phase shifted signals decreases).

In an example, assume it is desired to make $T_{out}$ equal to 4.85·$T_0$. Control circuit 26 determines that 4.85·$T_0$ is between $T_{out1}$=4.75·$T_0$ and $T_{out2}$=5.0·$T_0$, where 4.75·$T_0$ is four reference signal periods and four phase steps and 5.0·$T_0$ is five reference signal periods and zero phase steps. If circuit 23 alternately outputs S($T_{out1}$,Φ$_{out1}$) and S($T_{out2}$,Φ$_{out2}$) an equal number of times over M clock cycles, then $T_{out}$ will be 4.875·$T_0$ ((4.75·$T_0$+5.0·$T_0$)/2=4.875·$T_0$) which is within one phase step of 4.85·$T_0$.

However, if circuit 23 outputs S($T_{out1}$,Φ$_{out1}$) slightly more, then $T_{out}$ can be driven closer to 4.85·$T_0$. This is because the average will be reduced since $T_{out1}$ is less then $T_{out2}$. $T_{out1}$ can equal $T_{out2}$ if $T_{out}$ is an integer multiple of $T_0$. In this case, $T_{out1}$ and $T_{out2}$ will also be integer multiples of $T_0$ and the jitter will be minimal if toggle circuit 23 outputs only $T_{out1}$ or $T_{out2}$ without alternating between them.

Hence, synthesizer 16 provides S($T_{out}$,Φ$_{out}$) with a period $T_0$ that is an average of $T_{out1}$ and $T_{out2}$. The average can be adjusted by changing S$_{Control}$ and S$_{Enable}$ so that $T_{out1}$ and $T_{out2}$ are outputted a certain number of times over N clock cycles. If S($T_{out1}$,Φ$_{out1}$) is outputted more, then $T_{out}$ will decrease and if S($T_{out2}$,Φ$_{out2}$) outputted more, then $T_{out}$ will increase. In this way, the jitter of S($T_{out}$,Φ$_{out}$) can be driven to be on the order of one phase step if $T_{out1}$ and $T_{out2}$ are chosen to be within one phase step of $T_0$.

Figure 5:
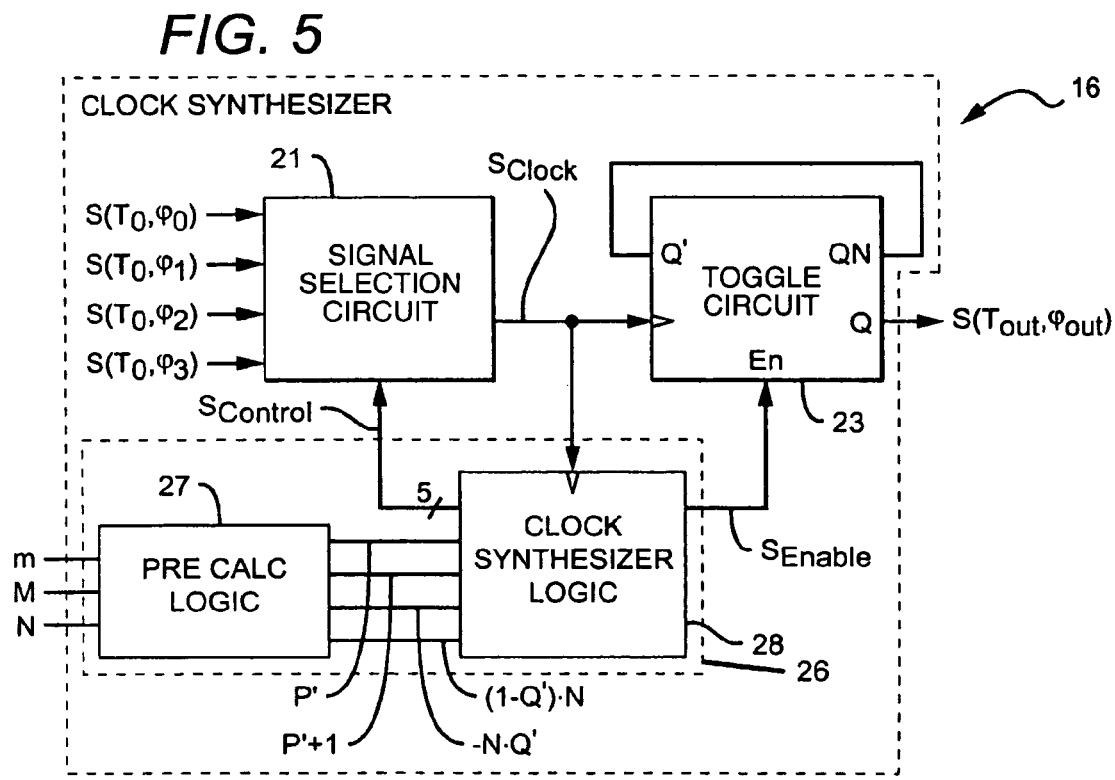
FIG. 5 is a more detailed block diagram of the frequency synthesizer shown in FIG. 3.

FIG. 5 illustrates a more detailed block diagram of synthesizer 16 illustrated in FIG. 3. In FIG. 5, signal selection circuit 21 includes a multiplexer and toggle circuit 23 includes a D-Flip Flop. Control circuit 26 includes a pre-calculation logic circuit 27 coupled to a clock synthesizer logic circuit 28. Clock synthesizer logic circuit 28 determines the reference clock cycles and the phase steps to provide S($T_{out1}$, φ$_{out1}$) and S($T_{out2}$, φ$_{out2}$). Circuit 21 can include other electronic circuitry which can receive multiple input signals and output one of the signals in response to a control signal, but a multiplexer is illustrated here for simplicity. Toggle circuit 23 can include other toggling circuitry, such as a J-K Flip Flop or a latch which can change the state of its output in response to an input signal.

Precalculation logic circuit 27 receives M, m, and N and, in response, outputs to logic circuit 28 P', P'+1, −N·Q', and (1−Q')·N according to the equality given by M·m/N=(P.Q)·m=P'.Q'. M and N are natural numbers and P and Q are integer and decimal numbers, respectively. Hence, M/N is a rational number expressed as a fraction and P.Q is its equivalent expressed as a decimal. P' is an integer number and Q' is a decimal number, respectively, of (P.Q)·m, which is the number of phase steps per clock cycle.

Hence, P' can be the number of phase steps in $T_{out1}$ and P'+1 can be the number of phase steps in $T_{out2}$. Values −N·Q' and (1−Q')·N are the error in the number of phase steps over N clock cycles if only S($T_{out1}$,Φ$_{out1}$) or S($T_{out2}$,Φ$_{out2}$), respectively, are outputted. Logic circuit 28 can provide S$_{Enable}$ and S$_{Control}$ to toggle circuit 23 and selection circuit 21, respectively, so that circuit 23 selectively outputs S($T_{out1}$,Φ$_{out1}$) and S($T_{out2}$,φ$_{out2}$), as discussed above, in response to signals P', P'+1, −N·Q', and (1−Q')·N. In this way, S($T_{out}$, Φ$_{out}$) is driven to be the average of S($T_{out1}$,Φ$_{out1}$) and S($T_{out2}$,Φ$_{out2}$).

In an example, assume it is desire to make $T_{out}$ equal to 4.58·$T_0$. This can be rewritten as (458/100)·$T_0$, so that M=458 and N=100. If there are m=32 phase steps per clock cycle, then M·m/N=(P.Q)·m=146.56 phase steps per reference signal period and P'=146 and Q'=0.56. In other words, 14,656 phase steps should be provided for every 100 reference clock cycles (i.e. N=100). In this case, precalculation circuit 27 will make $T_{out1}$=P'=146 phase steps, $T_{out2}$=P'+1=147 phase steps, −Q'·N=−56 phase steps, and (1−Q')·N=44 phase steps.

If $T_{out1}$ is outputted for N=100 clock cycles, then $T_{out}$ will be 14,600 phase steps which is underestimated by −Q'·N=−56 phase steps. If $T_{out2}$ is outputted for N=100 clock cycles, then $T_{out}$ will be 14,700 phase steps which is overestimated by (1−Q')·N=44 phase steps. Hence, values −Q'·N and (1−Q')·N are the errors in estimating $T_{out}$ by $T_{out1}$ and $T_{out2}$, respectively, over mM phase steps. Logic circuit 28 controls circuits 21 and 23 so that they alternately output one of $T_{out1}$=146 phase steps and $T_{out2}$=147 phase steps in response to logic circuit 28 so that an average of 14,566 phase steps are outputted after N=100 clock cycles. This will provide an average period of 146.56 phase steps per clock cycle, as desired.

Figure 6:
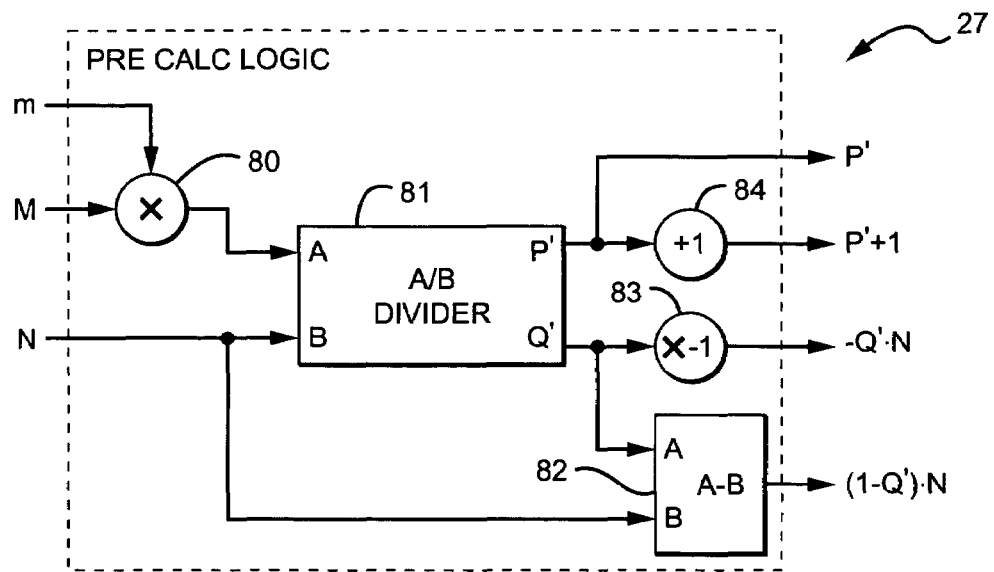
FIG. 6 is a more detailed block diagram of the pre-calculation logic circuit shown in FIG. 5.

FIG. 6 illustrates a simplified block diagram of circuit 27. Circuit 27 includes an A/B divider 81 where an input A is coupled to signals M and m through a multiplier 80. Multiplier 80 multiplies signal M by m and signal N is provided to input B. Signals N, m, and M can be provided from a memory element included in synthesizer 16 or they can be provided externally. Divider 81 forms the ratio m·M/N and outputs P' and Q' at respective outputs. An adder 84 adds one to P' to provide P'+1. A multiplier 83 provides signal −Q'·N and a logic circuit 82 is coupled to divider 81 to provide signal (1−Q')·N.

Figure 7:
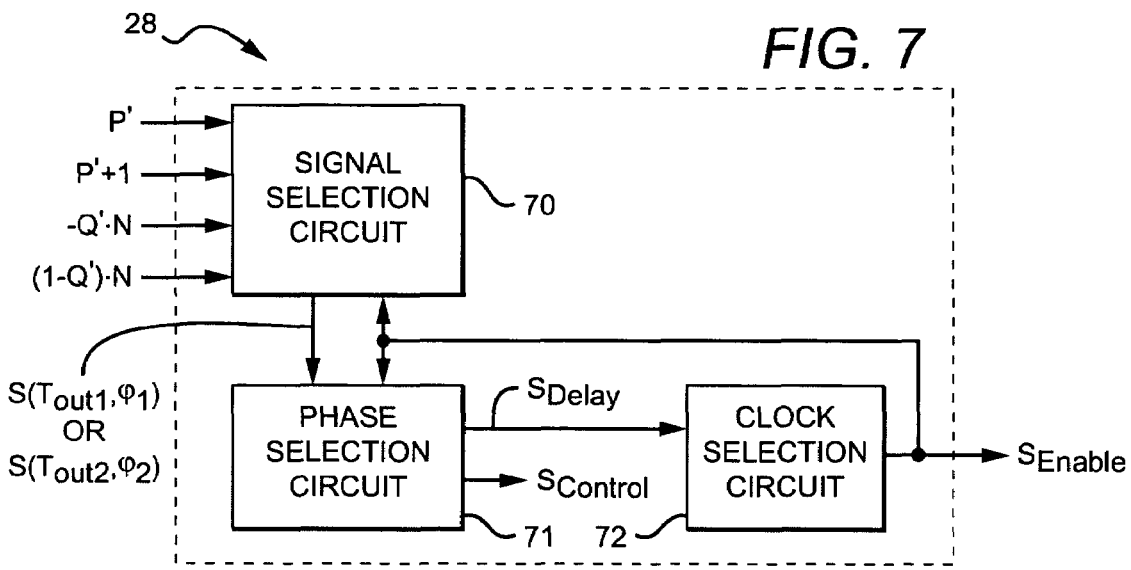
FIG. 7 is a simplified block diagram of the clock synthesis logic circuit shown in FIG. 5.

FIG. 7 illustrates a simplified block diagram of clock synthesizer logic circuit 28. Circuit 28 includes a signal selection circuit 70 coupled to a delay circuit 72 through a phase circuit 71. Circuit 70 receives signals P', P−+1, −Q'·N, and (1−Q)·N from circuit 27 and delay circuit 72 outputs S$_{Enable}$ to both circuits 70 and 71. Circuit 70 provides S($T_{out1}$, φ$_{out1}$) and S($T_{out2}$, φ$_{out2}$) at different times to circuit 71 and circuit 71 provides a signal S$_{Delay}$ to circuit 72 where S$_{Delay}$ is equal to P. Circuit 71 also outputs signals S$_{Control}$ and S$_{Snable}$ to signal selection circuit 21 and toggle circuit 23, respectively (See FIG. 5).

In operation, circuit 70 determines which signal period, $T_{out1}$=P' or $T_{out2}$=P'+1, is outputted to circuit 71. This can be done by forming an error signal, denoted as S$_{Error}$, which is equal to the error in the number of phase steps in providing mM phase steps. For example, if the average output period is less than the desired output period (i.e. $T_{out}$) then circuit 28 is underestimating the desired period. In this case, circuit 70 will output $T_{out2}$ more to overestimate the period for a certain number of clock cycles so that the average period is increased to the desired period. If the average period is greater than the desired period, then circuit 70 will output $T_{out1}$ more to underestimate the desired period for a certain number of clock cycles so that the average period is decreased to the desired period.

Circuit 72 determines the number of full clock cycles, as indicated by P, that are in $T_{out1}$ and $T_{out2}$. Circuit 72 can determine the number of clock cycles by counting up, down, or by delaying for a predetermined amount of time before triggering $S_{Enable}$. $S_{Enable}$ is also provided to toggle circuit 23 so that it will be triggered at the correct time points to provide $S(T_{out1},\Phi_{out1})$ and $S(T_{out2},\Phi_{out2})$ with the correct high-to-low and low-to-high pulse edges as provided by signal selection circuit 21.

In response to $S_{Enable}$, phase selection circuit 71 determines the number of phase steps as indicated by Q'. The phase steps correspond to the fractional portion of $T_{out1}$ or $T_{out2}$ as provided by signal selection circuit 70. Circuit 71 can determine the correct number of phases by counting up, down, or by delaying for a predetermined amount of time. Once the correct number of phases has been determined, circuit 71 outputs this value to signal selection circuit 21 as $S_{Control}$ and, in response, circuit 21 outputs the correct phase shifted reference signal.

Figure 8:
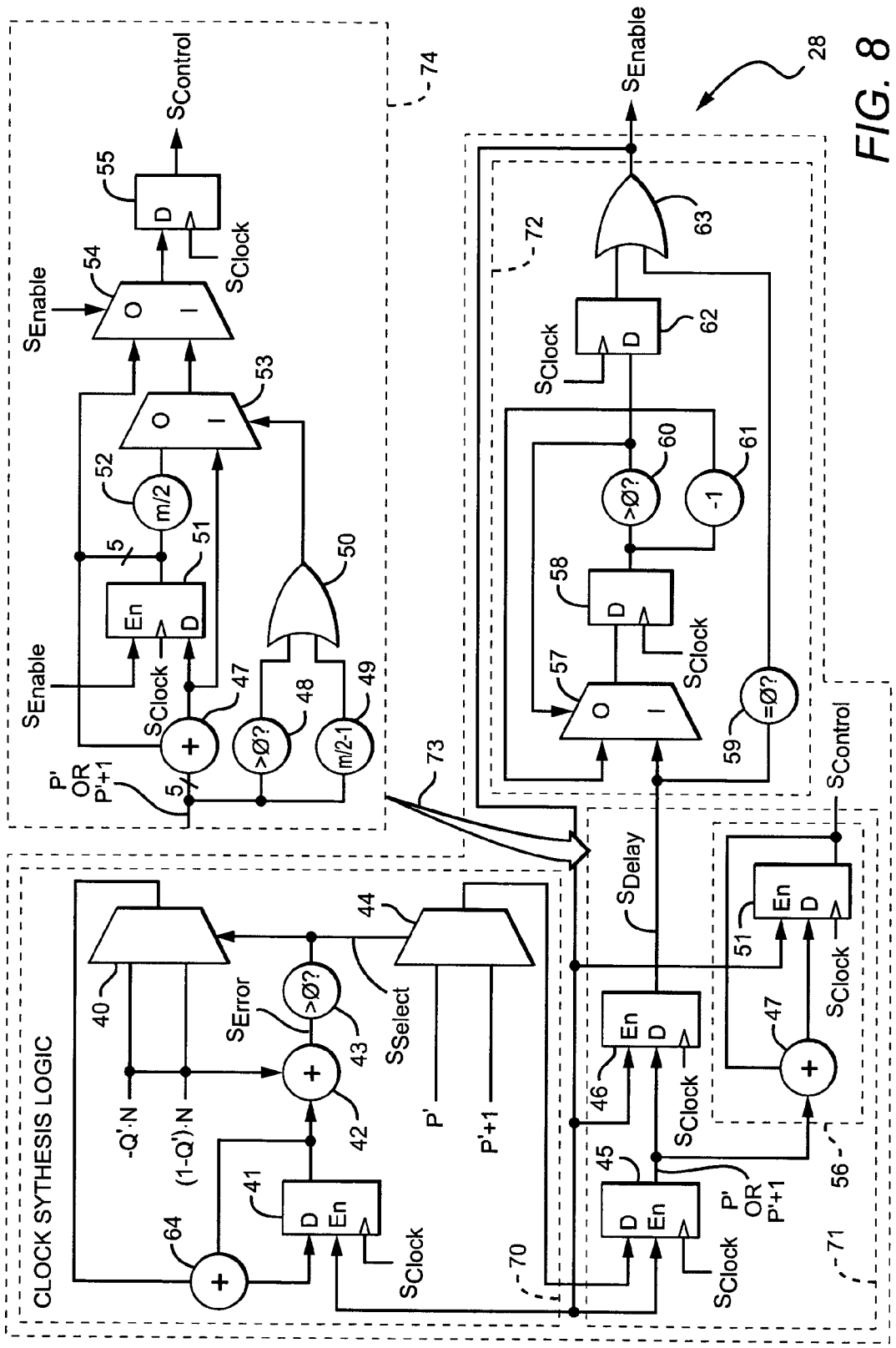
FIG. 8 is a more detailed block diagram of the clock synthesis logic shown in FIG. 7.

FIG. 8 illustrates a more detailed diagram of clock synthesizer logic circuit 28. Signal selection circuit 70 includes an error register 41 clocked by $S_{clock}$. An output of register 41 is coupled to an adder 64 and a comparator circuit 43 through an adder 42. An output of comparator 43 is coupled to enables of signal selects 40 and 44. Signals –Q'·N and (1–Q')·N are provided to respective inputs of signal select 40 and signals P' and P'+1 are provided to respective inputs of signal select 44. An output of signal select 44 is coupled to phase circuit 71 and an output of signal select 40 is coupled to the input of register 41 through adder 64.

In operation, register 41 outputs its stored value during the current clock cycle, which can be zero at start-up. This value is added to –Q'·N (a negative number) by adder 42 to produce $S_{Error}$ which is then compared to zero. If $S_{Error}$ is less then zero, then signal select 40 outputs (1–Q')·N (a positive number) in response to $S_{Select}$. Signal (1–Q')·N is then added to the current stored value in register 41 and the result is stored in register 41 during the next clock cycle. The sequence is then repeated and $S_{Error}$ becomes less negative until it is greater than zero. During the first clock cycle that $S_{Error}$ is greater than zero, signal select 40 will output (1–Q')·N to adder 64 in response to $S_{Select}$. In this way, register 41 keeps a running total of the number of phase steps and adjusts the total so that m·M phase steps are provided for every N clock cycles.

Phase selection circuit 71 includes a phase step register 45 with an input coupled to the output of signal select 44. An output of register 45 is coupled to a delay register 46 and an adder 47. An output of register 46 is coupled to clock selection circuit 72. An output of adder 47 is coupled to an input of a phase select register 51. An output of register 51 is coupled to its input through adder 47 and also provides $S_{Control}$ to signal selection circuit 21 (See FIG. 3).

Register 45 receives P' or P'+1 from signal select 44 which are typically in digital form. The bits in P' or P'+1 that correspond to the clock cycle are outputted by register 46 to clock selection circuit 72. Circuit 72 includes a signal select 57 with an output coupled to a clock select register 58. An output of register 58 is coupled to a comparator 60 and a subtractor 61. The output of register 46 and an output of subtractor 61 are coupled to respective inputs of signal select 57. An output of comparator 60 is coupled to an enable of signal select 57. The output of register 46 is also coupled to an input of an OR gate 63 through a comparator 59. The output of comparator 60 is coupled to another input to gate 63 through an enable register 62. Registers 58 and 62 are clocked by $S_{Clock}$.

Clock selection circuit 72 receives the bits in P' or P'+1 that correspond to the number of clock cycles and counts down to zero from this number during which time $S_{Enable}$ is switched from low to high for one clock cycle. $S_{Enable}$ is outputted to toggle circuit 21 (See FIG. 3) and is also coupled to the enables of registers 41, 45, and 46. In response to $S_{Enable}$ being high, phase selection circuit 71 determines which phase step should be outputted by signal selection circuit 21 in response to $S_{Control}$.

Phase selection circuit 71 determines $S_{Control}$ by receiving the bits that correspond to the phase steps in signals P' or P'+1 from register 45. These bits correspond to the phase step that is to be outputted by signal select circuit 21. This value is stored in register 51 so that it can be added to the phase steps in the next clock cycle when $S_{Enable}$ is high again.

Adder 47 and register 51 form a phase select circuit 56 which can be substituted for by a phase select circuit 74, as indicated by substitution arrow 73. Circuit 74 can be used to reduce timing errors when counting phase steps. Circuit 73 includes an adder 52 coupled to the output of register 51. The output of adder 52 and the input of register 51 are coupled to respective inputs of a signal select 53. The output of register 51 and the output of signal select 53 are coupled to respective inputs of a signal select 54. An output of signal select 54 is coupled to a phase delay register 55 which provides $S_{Control}$ at its output. The output of register 45 is also coupled to inputs of comparator 48 and a comparator 49. Outputs of comparators 48 and 49 are coupled to respective inputs of an OR gate 50. An output of gate 50 is coupled to an enable of signal select 53 and an enable of signal select 54 is coupled to $S_{Enable}$.

Phase selection circuit 74 determines $S_{Control}$ by receiving the bits that correspond to the phase steps in signals P' or P'+1 from register 45. These bits are compared to zero by comparator 48 and to (m/2)–1 by comparator 49. If the bits are equal to zero or greater than (m/2)–1, then gate 50 enables signal select 53 to output the input of register 51 to signal select 54. This value is then outputted by register 55 as $S_{Control}$ on the next clock cycle.

However, if the bits are between zero and (m/2)–1, then circuit 72 counts one fewer clock cycles in response to an indication from register 46. In these instances, gate 50 makes the enable of signal select 53 low so that m/2 phase steps (i.e. one-half a clock cycle) are added to $S_{Control}$ during the next clock cycle. The phase steps are then counted as before and $S_{Control}$ is outputted. For example, assume m=32 and it desired to provide 133 phase steps. This corresponds to four clock cycles and five phase steps. Circuit 72 will count three clock cycles which corresponds to 96 phase steps (3·32 phase steps=96 phase steps). Adder 52 will then add 16 phase steps to give 112 phase steps and circuit 74 will count 21 more phase steps to give a total of 133 phase steps, as desired.

Hence, circuit 74 ensures that $S_{Control}$ does not count by a number of phase steps less then m/2. This avoids timing errors which can result when counting between one or two phase steps, for example. The timing errors can occur because the probability of missing a clock edge increases as the number of phase-shifted reference signals increases. Hence, the timing errors are significantly reduced when counting a number of phase steps larger than m/2.

Figure 9:
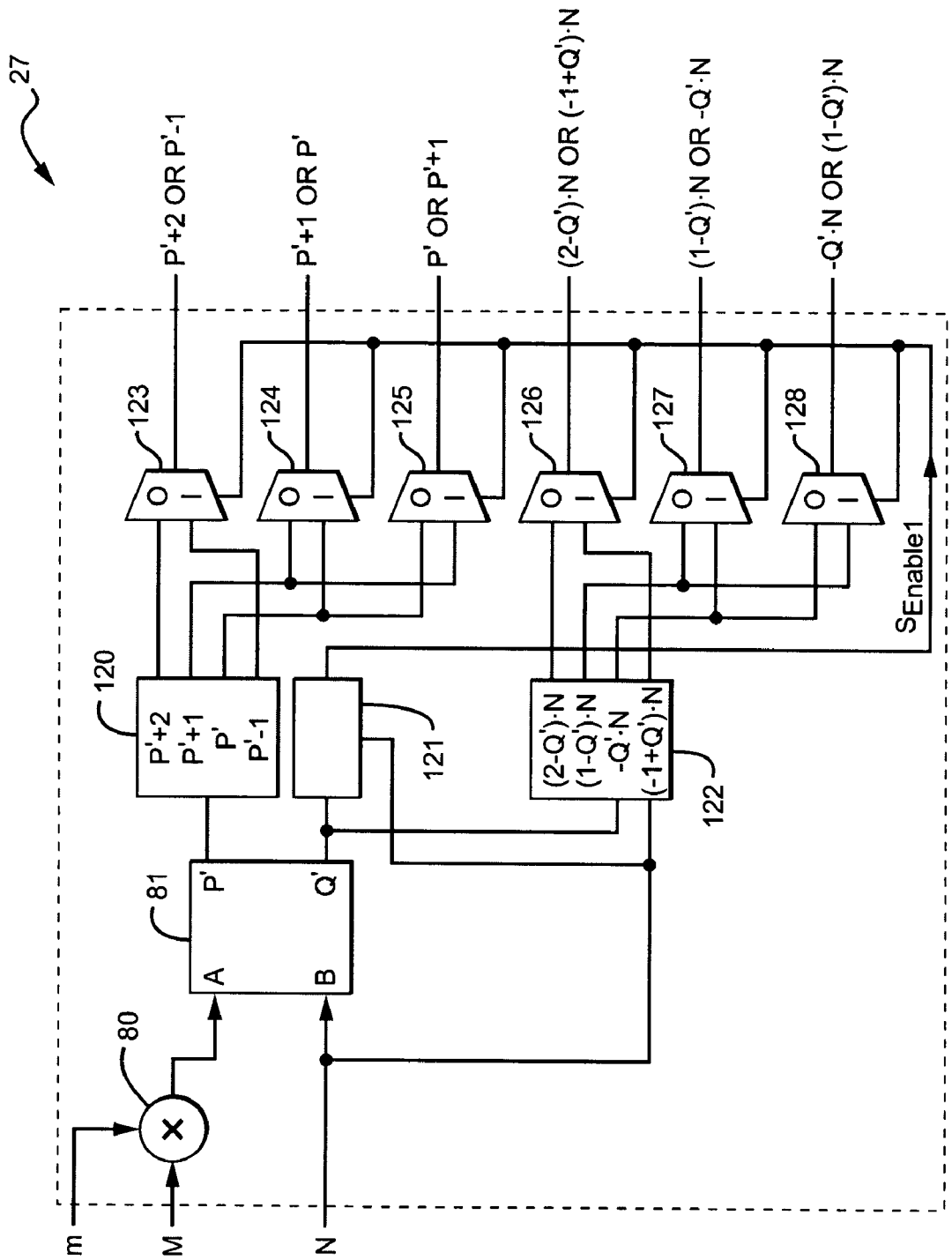
FIG. 9 is a block diagram illustrating another embodiment of the pre-calculation logic circuit shown in FIG. 5.

FIG. 9 illustrates another embodiment of pre-calculation logic circuit 27. FIG. 9 includes a logic circuit 120 which receives signal P' from the output of A/B divider 81 and logic circuits 121 and 122 which receive signals Q' and N. Logic circuit 120 provides values P'+2 and P'–1 to respective inputs of a signal select 123, P'+1 and P' to respective inputs of a signal select 124, and P' and P'–1 to respective inputs of a signal select 125. Logic circuit 122 provides (2–Q')·N and (–1+Q')·N to respective inputs of a signal select 126, (1−Q')·N and −Q'·N to respective inputs of a signal select 127, and −Q'·N and (1−Q')·N to respective inputs of a signal select 128.

Logic circuit 121 provides an enable signal $S_{Enable1}$ to enable terminals of signal selects 123, 124, 125, 126, 127, and 128. When $S_{Enable1}$ is high, signal selects 123, 124, and 125 can output P'−1, P', and P'+1, respectively, and signal selects 126, 127, and 128 can output (−1+Q')·N, −Q'·N, and (1−Q')·N, respectively. When $S_{Enable1}$ is low, signal selects 123, 124, and 125 can output P'+2, P'+1, and P', respectively, and signal selects 126, 127, and 128 can output (2−Q')·N, (1−Q')·N, and −Q'·N, respectively.

In operation, circuit 27 provides three signals to circuit 28 to dither between instead of two. The signals can be chosen based on how close −Q'N is to P' or P'+1 as determined by logic circuit 121. For example, if signal −Q'N is closer to P', then $S_{Enable1}$ is high and the dithering is between P'−1, P', and P'+1. However, if −Q'N is closer to P'+1, then $S_{Enable1}$ is low and the dithering is between P', P'+1, and P'+2. By dithering between three signals, low frequency fluctuations in $S(T_{out},\phi_{out})$ are reduced. For example, if the period is close to P' and the dithering is only between P' and P'+1 as discussed in conjunction with FIG. 6, then the period will be P' for most of the M-m phase steps before it changes to P'+1 for a few phase steps towards the end. This change for only a few phase steps will cause low frequency fluctuation in the period which can increase the signal-to-noise ratio.

Figure 10:
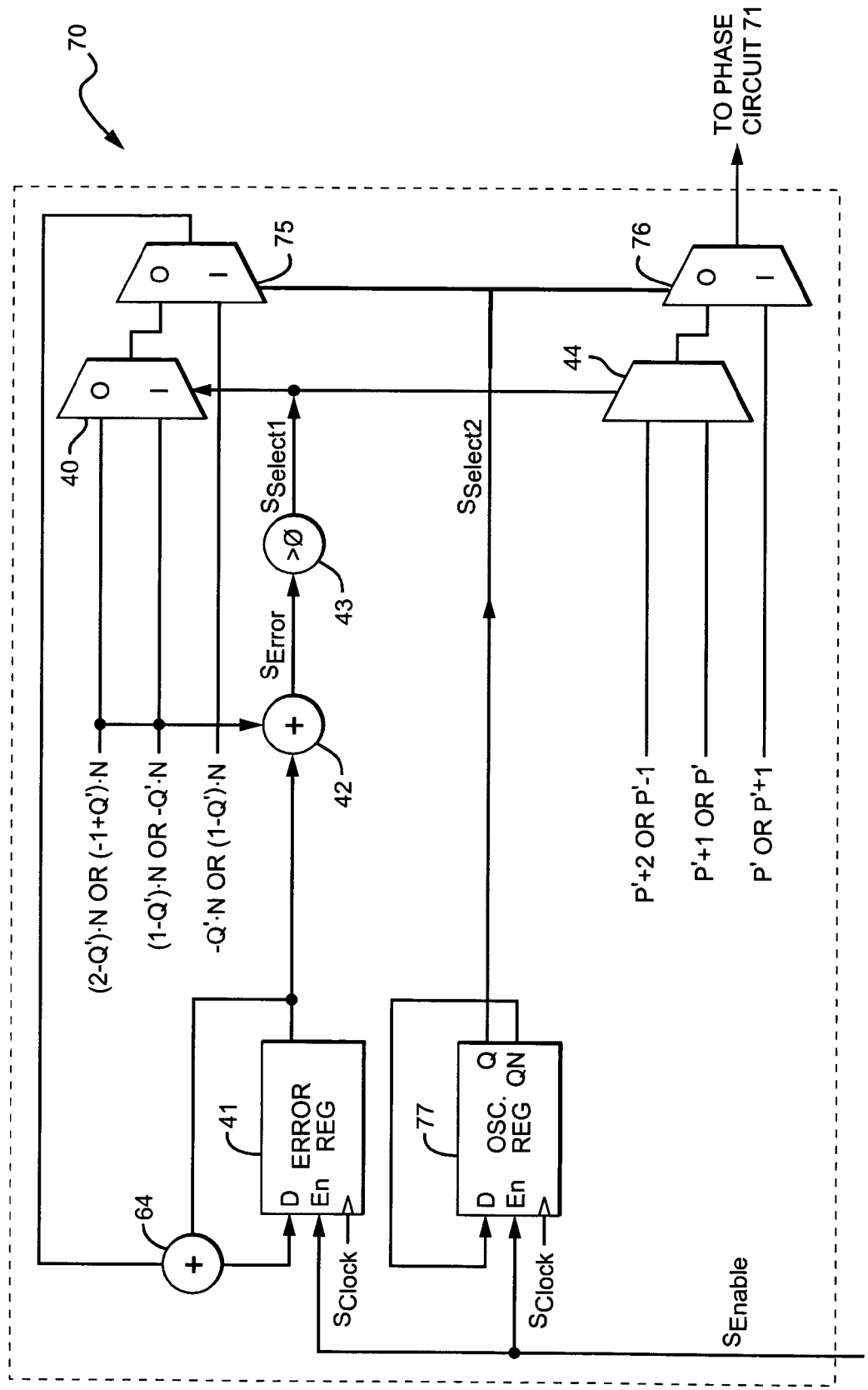
FIG. 10 is a block diagram illustrating another embodiment of the signal selection circuit shown in FIG. 7.

FIG. 10 illustrates another embodiment of signal selection circuit 70. In FIG. 10, circuit 70 is coupled to pre-calculation circuit 27 as illustrated in FIG. 9. Signal selection circuit 70 includes error register 41 clocked by $S_{clock}$ with the output coupled to adder 64 and comparator circuit 43 through adder 42. The output of comparator 43 is coupled to enables of signal selects 40 and 44. The output of signal select 40 is coupled to an input of a signal select 75 and the output of signal select 75 is coupled to adder 64.

A D flip-flop 77 has an enable coupled to the enable of register 41 and a clock terminal coupled to $S_{Clock}$. The inverting output of flip-flop 77 is coupled to its D input and its non-inverting output is coupled to enables of signal select 75 and a signal select 76. The output of signal select 44 is coupled to an input of signal select 76 and the output of signal select 76 is coupled to circuit 71.

Respective inputs of signal select 44 receive signals P'+2 and P'+1 when $S_{Enable1}$ is low and receive P'−1 and P' when $S_{Enable1}$ is high. The other input of signal select 76 receives P' when $S_{Enable1}$ is low and P'+1 when $S_{Enable1}$ is high. Signals (2−Q')·N and (1−Q')·N are provided to respective inputs of signal select 40 when $S_{Enable1}$ is high and (−1+Q')·N and −Q'·N are provided when $S_{Enable1}$ is low. Signal −Q'·N is provided to the other input of signal select 75 when $S_{Enable1}$ is low and (1−Q')·N is provided when $S_{Enable1}$ is high.

In operation and assuming $S_{Enable1}$ is low, register 41 outputs its stored value during the current clock cycle, which can be zero at start-up. This value is added to (1−Q')·N by adder 42 to produce $S_{Error}$ which is then compared to zero. If $S_{Error}$ is less then zero, then a signal $S_{Select1}$ is low and signal select 40 outputs (2−Q')·N and signal select 44 outputs P'+2. Signal (1−Q')·N is then added to the current stored value in register 41 and the result is stored in register 41 during the next clock cycle.

When $S_{Error}$ becomes greater than zero, $S_{Select\ 1}$ will be high and signal selects 40 and 44 will output (1−Q')'N and P'+1, respectively, and the process will repeat. Flip-Flop 77 behaves as an oscillator which alternately makes a signal $S_{Select\ 2}$ and low. In this way, the value outputted to circuit 71 by signal select 76 is different for every clock cycle. Hence, the period is moving between three sub-frequencies instead of two so that if the desired period is close to P' or P'+1, then the circuit will not output these values too many times in a row. It will instead alternate between outputting P'−1, P', and P'+1 if the period is near P' or P', P'+1, and P'+2 if the period is near P'+1. In this way, low frequency oscillations in $T_{out}$ will be reduced because the jitter in S ($T_{out}, \phi_{out}$) is always changing.

Figure 11:
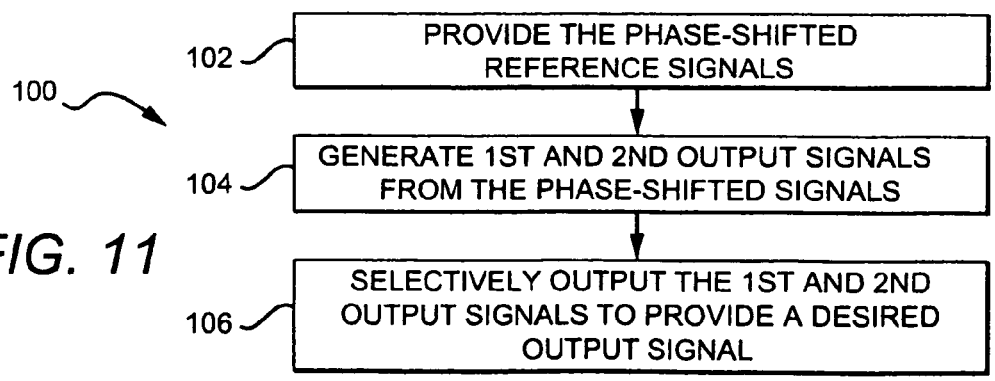
FIG. 11 is a simplified flow diagram of a method of providing an output signal in accordance with the present invention.

FIG. 11 illustrates a simplified flow diagram 100 of a method of generating an output signal with a desired period. The method includes a step 102 of providing phase-shifted reference signals. The phase-shifted reference signals generally have the same period and an equal spacing across the reference signal period. A step 104 includes generating first and second signals in response to the phase-shifted reference signals. A step 106 includes a step of outputting one of the first and second signals so that an average period of an output signal is driven to within a predetermined number of phase steps of a desired period.

The first and second signals are typically generated by choosing edges of the reference signals so that the first and second signals have periods which are a certain number of phase steps from the desired period. The first and second signals can be generated by counting periods and/or phase steps in the phase-shifted reference signals. If counting phase steps, then step 104 can include a step of counting a predetermined minimum number of phase steps to reduce timing errors. This can be done if the phase steps are closely spaced to avoid missing a clock edge.

Step 106 can include a step of outputting one of the first and second signals in response to an error signal. The error signal can be proportional to the difference between the average and desired periods. The first and second signals can be outputted with periods an integer multiple of the reference clock period or the multiple can be given by P.Q. Hence, the first and second signals can be generated by counting a number of reference signal periods equal to P and a number of phase steps equal to N·Q.

In step 106, the first and second signals can be alternately outputted in response to the error signal, where the error signal is typically chosen to drive (P.Q)·m to be M·m/N. Hence, the error signal can be adjusted in response to an indication that M·m/N does not equal (P.Q)·m. To do this, the error signal can be decreased by N·Q phase steps in response to an indication that (P.Q)·m is greater than M·m/N or it can be increased by (1−Q)·N phase steps in response to an indication that (P.Q)·m is less than M·m/N. The error signal is typically adjusted to drive the average period to be within one phase step of the desired period to minimize the jitter in the output signal.

Figure 12:
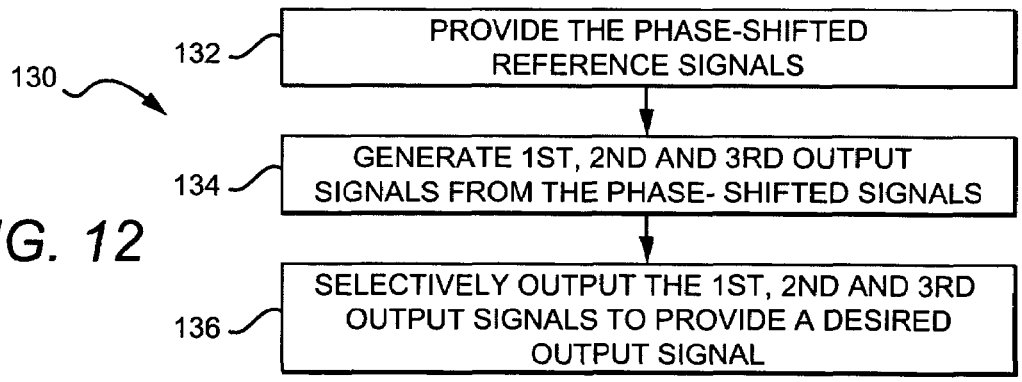
FIG. 12 is a simplified flow diagram of another method of providing the output signal in accordance with the present invention.

FIG. 12 illustrates a simplified flow diagram 130 of another method of generating the output signal with a desired period. The method includes a step 132 of providing the phase-shifted reference signals. A step 134 includes generating first, second, and third signals in response to the phase-shifted signals. The first, second, and third signals can be generated as in method 100. A step 136 includes a step of outputting one of the first, second, and third signals so that the average period of the output signal is driven to within a predetermined number of phase steps of a desired period.

Step 136 can include a step of providing the second signal with a period greater than the first signal when the desired period is a non-integer multiple of the reference signal period. The period of the third signal can be chosen based on how close the desired period is to P' or P'+1 phase steps. If the desired period is closer to P' phase steps, then the third signal can have a period less than P' and if the desired period is closer to P'+1 phase steps, then the third signal can have a period greater than P'+1. In this way, the first, second, and third signals can be selectively outputted in step 136 so that the jitter is different in each sequential clock cycle. By changing the jitter, low frequency signals in the desired output signal can be minimized.

Step 136 can include a step of alternating between outputting the first, second, and third signals in response to the error signal. The error signal can be adjusted in response to an indication that M·m/N does not equal P.Q in a manner similar to method 100. Hence, the error signal can be decreased by N·Q or (Q+1)·N in response to an indication that (P.Q)·m is greater than M·m/N. The error signal can also be increased by (1−Q)·N or (2−Q)·N in response to an indication that (P.Q)·m is less than M·m/N.

If the desired period is close to P', then step 136 can include a step of adjusting the error signal by one of (Q+1)·N, Q·N, and (N−Q) in response to an indication that M·m is within a predetermined number of phase steps from (P.Q)·m·N. If the desired period is close to P'+1, then step 136 can include a step of adjusting the error signal by one of Q·N, (1−Q)·N, and (2−Q)·N in response to an indication that M·m is within a predetermined number of phase steps from (P+1)·N·m.

Thus, a frequency synthesizer that can provide an output signal with a period being a multiple of another signal period has been disclosed. The synthesizer can selectively output two or more signals with periods close to the desired period of the output signal. The periods of the signals can be provided by phase shifted reference signals. The signals can be selectively outputted so that the average period of the output signal is driven to the desired period. More than two output signals can be used and dithered between to minimize low frequency signals in the output signal. In this way, the frequency synthesizer can provide less jitter at a given reference frequency.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A synthesizer for generating an output signal with an output period that approximates a desired period, comprising:
   a signal selection circuit which has access to m phase-shifted reference signals that have a common reference period and that define m phase steps
   a toggle circuit; and
   a control circuit configured to:
      determine selected ones of said reference signals whose phase steps will define first and second signals having first and second periods which differ by one of said phase steps and are respectively less than and greater than said desired period;
      provide a control signal to said signal selection circuit to obtain, one at a time, said selected reference signals and an enable signal to said toggle circuit to generate, in response to said selected reference signals, said first and second signals in a selected sequence to thereby form an output signal whose average output period differs from said desired period by an error; and
      alter said sequence to reduce said error.

2. The synthesizer of claim 1, wherein said control circuit includes a pre calculation logic circuit configured to calculate first and second numbers of phase steps in said first and second signals and first and second errors between said first and second periods and said desired period.

3. The synthesizer of claim 2, wherein said control circuit further includes:
   a clock synthesizer logic circuit configured to determine said selected reference signals in response to said first and second numbers and to alter said sequence in response to said first and second errors.

4. The synthesizer of claim 1, wherein said signal selection circuit is a multiplexer.

5. The synthesizer of claim 1, wherein said toggle circuit is a flip-flop.

6. The synthesizer of claim 1, further including a multiphase signal generator that generates said m phase-shifted reference signals.

7. A method for generating an output signal with an output period that approximates a desired period, comprising the steps of:
   providing m reference signals that have a common reference period and are phase-shifted to thereby define m phase steps;
   determining selected reference signals whose phase steps will define first and second signals having first and second periods which are respectively less than and greater than said desired period;
   in response to said selected reference signals, generating said first and second signals in a selected sequence to thereby form an output signal whose average output period differs from said desired period by an output error; and
   altering said sequence to reduce said output error.

8. The method of claim 7, wherein said generating step includes the steps of:
   one signal at a time, multiplexing said selected reference signals to a toggle circuit; and
   enabling said toggle circuit to form said first and second signals in response to multiplexed ones of said reference signals.

9. The method of claim 7, wherein said determining step includes the step of selecting said first and second periods to differ by one of said phase steps.

10. The method of claim 7, wherein said altering step includes the steps of:
    determining a first error between said first period and said desired period and a second error between said second period and said desired period;
    with said first and second errors, determining said output error from the first and second signals that are included in said sequence.

* * * * *